United States Patent
Zheng et al.

(10) Patent No.: US 6,429,109 B1
(45) Date of Patent: Aug. 6, 2002

(54) METHOD TO FORM HIGH K DIELECTRIC AND SILICIDE TO REDUCE POLY DEPLETION BY USING A SACRIFICIAL METAL BETWEEN OXIDE AND GATE

(75) Inventors: Jia Zhen Zheng; Elgin Quek; Mei Sheng Zhou; Daniel Yen; Chew Hoe Ang; Eng Hua Lim; Randall Cha, all of Singapore (SG)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 10/017,953

(22) Filed: Dec. 14, 2001

(51) Int. Cl.$^7$ ........................................... H01L 21/4763
(52) U.S. Cl. ..................... 438/591; 438/585; 438/287; 438/240
(58) Field of Search ................. 438/591, 585, 438/287, 240

(56) References Cited

U.S. PATENT DOCUMENTS

| 4,115,914 A | 9/1978 | Harari | 29/571 |
| 5,304,503 A | 4/1994 | Yoon et al. | 437/43 |
| 6,027,975 A | 2/2000 | Hergenrother et al. | 438/268 |
| 6,171,900 B1 | 1/2001 | Sun | 438/240 |
| 6,184,087 B1 | 2/2001 | Wu | 438/260 |

*Primary Examiner*—Long Pham
(74) *Attorney, Agent, or Firm*—George O. Saile; Rosemary L. S. Pike; Stephen G. Stanton

(57) ABSTRACT

A method of forming a gate comprising the following steps. A substrate is provided. A pre-gate structure is formed over the substrate. The pregate structure includes a sacrificial metal layer between an upper gate conductor layer and a lower gate dielectric layer. The pre-gate structure is annealed to form the gate. The gate comprising: an upper silicide layer formed from a portion of the sacrificial metal layer and a portion of the upper gate conductor layer from the anneal; and a lower metal oxide layer formed from a portion of the gate dielectric layer and a portion of the sacrificial metal layer from the anneal.

35 Claims, 1 Drawing Sheet

METHOD TO FORM HIGH K DIELECTRIC AND SILICIDE TO REDUCE POLY DEPLETION BY USING A SACRIFICIAL METAL BETWEEN OXIDE AND GATE

FIELD OF THE INVENTION

The present invention relates generally to fabrication of semiconductor devices, and more specifically to methods of fabricating semiconductor gates.

BACKGROUND OF THE INVENTION

As semiconductor devices scale down, gate leakage and polysilicon (poly) depletion have become critical issues.

U.S. Pat. No. 6,171,900 to Sun describes a method for fabricating a CVD $Ta_2O_5$/oxynitride stacked gate insulator with TiN gate electrode for sub-quarter micron MOSFETs (metal-oxide semiconductor field effect transistors).

U.S. Pat. No. 6,027,975 to Hergenrother et al. describes a process for fabricating a vertical MOSFET device for use in integrated circuits.

U.S. Pat. No. 4,115,914 to Harari describes a process for fabricating a nonvolatile field effect transistor in which an electrically floating gate acts as a charge storage medium.

U.S. Pat. No. 6,184,087 to Wu describes a method for fabricating a high speed and high density nonvolatile memory cell.

U.S. Pat. No. 5,304,503 to Yoon et al. describes a method for fabricating an EPROM (erasable programmable read only memory) cell array.

SUMMARY OF THE INVENTION

Accordingly, it is an object of an embodiment of the present invention to provide an improved method of fabricating a gate dielectric with reduced gate leakage.

Another object of an embodiment of the present invention is to provide an improved method of fabricating a gate electrode with reduced poly depletion.

A further object of an embodiment of the present invention is to provide a method to improve transistor performance.

Yet another object of an embodiment of the present invention is to provide a method of fabricating a high-k dielectric.

Other objects will appear hereinafter.

It has now been discovered that the above and other objects of the present invention may be accomplished in the following manner. Specifically, a substrate is provided. A pre-gate structure is formed over the substrate. The pregate structure includes a sacrificial metal layer between an upper gate conductor layer and a lower gate dielectric layer. The pre-gate structure is annealed to form the gate. The gate comprising: an upper silicide layer formed from a portion of the sacrificial metal layer and a portion of the upper gate conductor layer from the anneal; and a lower metal oxide layer formed from a portion of the gate dielectric layer and a portion of the sacrificial metal layer from the anneal.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
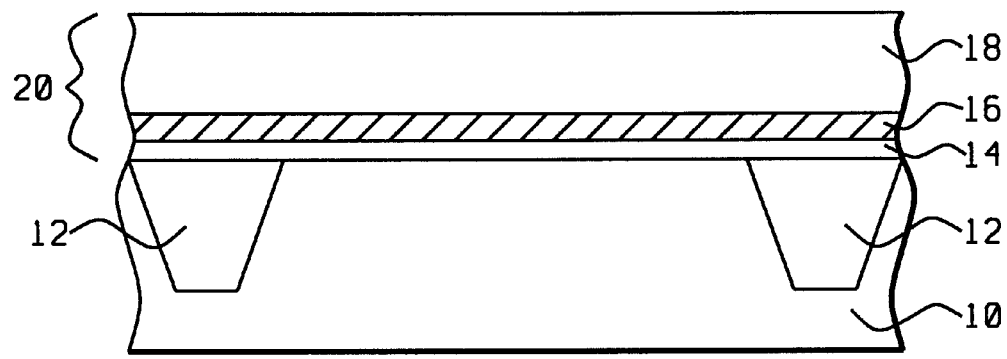
FIGS. 1 to 3 schematically illustrate in cross-sectional representation a preferred embodiment of the present invention.

Unless otherwise specified, all structures, layers, etc. may be formed or accomplished by conventional methods known in the prior art.
Initial Structure FIG. 1 illustrates a cross-sectional view of a wafer 10, preferably a semiconductor wafer, that may have conventional device isolation such as shallow trench isolation (STI) structures 12 formed within wafer 10.
Formation of Gate Dielectric Layer 14

Gate dielectric layer 14 is formed over wafer 10 and STI 12 to a thickness of preferably from about 5 to 200 Å and more preferably from about 10 to 60 Å. Gate dielectric layer 14 is preferably comprised of $SiO_2$ (oxide) formed by an oxidation process, an atomic layer deposition process or a chemical vapor deposition process and is more preferably $SiO_2$ (oxide) grown by an oxidation process either in a furnace or by rapid thermal processing.

An optional etch stop layer (not shown), preferably SiN or SiON, may be formed over gate dielectric layer 14.
First Key Step of the Invention—Formation of Sacrificial Metal Layer 16

In a key step of the invention and as shown in FIG. 1, a sacrificial metal layer 16 is formed over gate dielectric layer 14 to a thickness of from about 5 to 500 Å, more preferably from about 10 to 200 Å, and most preferably from about 10 to 100 Å. Sacrificial metal layer 16 is preferably comprised of Ti, Ta, Zr, Hf or Al, is more preferably comprised of Ti or Ta and is most preferably comprised of Ta.

Sacrificial metal layer 16 is preferably formed by physical vapor deposition, atomic layer deposition, chemical vapor deposition or photo-induced chemical deposition and is more preferably formed by physical vapor deposition at the following parameters:

temperature: from about 50 to 500° C.;

pressure: from about 0.1 to 500 mTorr; and power: from about 100 to 5000 W.

Gate Conductor Layer 18 Deposition

As shown in FIG. 1, gate conductor layer 18 is then formed over sacrificial metal layer 16 to a thickness of preferably from about 300 to 2000 Å and more preferably from about 500 to 1500 Å. Gate conductor layer 18 is preferably comprised of deposited polysilicon (poly), poly SiGe or poly SiGe with a tungsten or tungsten silicide cap and is more preferably comprised of deposited polysilicon (poly).

Figure 2:
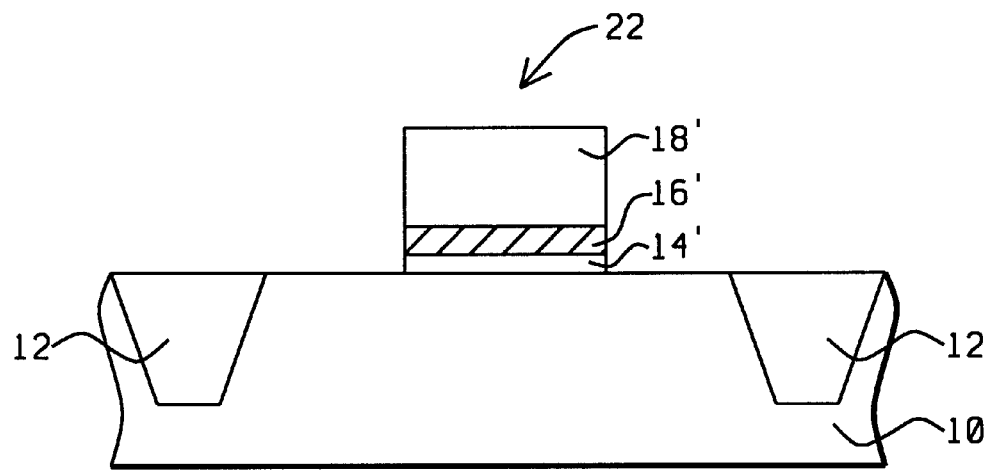

This completes formation of the gate stack 20 comprising gate conductor layer 18/sacrificial metal layer 16/gate dielectric layer 14.
Gate Patterning and Etching As shown in FIG. 2, gate stack 20 is sequentially patterned and etched to form pre-gate structure 22 comprising etched gate conductor layer 18'/etched sacrificial metal layer 16'/etched gate dielectric layer 14'. Pre-gate structure 22 may have any width as defined on circuits and is patternable by any state of the art lithography. The etching is done sequentially, i.e. conductor layer 18 is first etched with selectivity to sacrificial metal layer 16; and then sacrificial metal layer 16 is etched with good selectivity to gate dielectric layer 14. The etch will leave some gate dielectric layer 14 on substrate 10 (and possibly some of the optional etch stop formed over gate dielectric layer 14) which may be subsequently removed by HF for example.

Second Key Step of the Invention—Rapid Thermal Anneal 24

Figure 3:
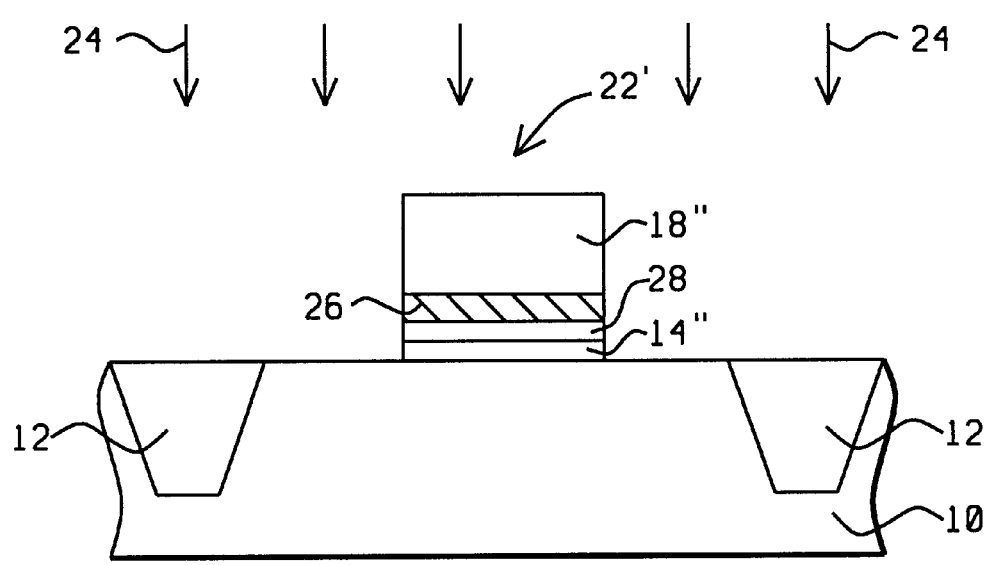

As shown in FIG. 3 and in the second key step of the invention, preferably a rapid thermal anneal (RTA) 24 is conducted which: consumes a portion of etched gate conductor layer 18' and etched sacrificial metal layer 16' to form an upper metal silicide layer 26; and consumes a portion of etched gate dielectric layer 14' and etched sacrificial metal layer 16' to form lower metal oxide layer 28, thus completing formation of finalized gate 22'.

The rapid thermal anneal 24 is conducted at the following parameters:
- temperature: preferably from about 400 to 1000° C.; and more preferably from about 550 to 850° C.;
- time: preferably from about 5 to 180 seconds; and more preferably from about 20 to 60 seconds;
- ramp rate: preferably from about 25 to 400° C./second; and more preferably from about 50 to 250° C. /second; and
- ambient atmosphere: preferably nitrogen, argon or helium and more preferably nitrogen.

Finalized gate 22' is preferably about 100 Å wide or wider and is more preferably about 300Å wide or wider.

Preferably etched sacrificial metal layer 16' is totally consumed. In another embodiment of the invention a portion of etched sacrificial metal layer 16' may remain sandwiched between metal silicide layer 26 and metal oxide layer 28.

Metal silicide layer 26 has a thickness of preferably from about 10 to 500 Å and more preferably from about 20 to 100 Å leaving remaining etched gate conductor layer 18" having a thickness of preferably from about 300 to 2000 Å and more preferably from about 500 to 1500 Å.

Metal oxide layer 28 has a thickness of preferably from about 5 to 200 Å and more preferably from about 10 to 100 Å leaving remaining etched gate dielectric layer 14" having a thickness of preferably from about 0 to 100 Å and more preferably from about 5 to 50 Å.

A normal formation sequence of source/drain extension, spacers and source/drain formation is followed to form transistors.

Metal oxide layer 28 has a higher dielectric constant as compared to silicon dioxide so for the same gate 18" to substrate 10 capacitance, it is possible to use a thicker metal oxide layer 28 and this can reduce leakage current between gate 18" and substrate 10.

Metal silicide layer 26 is a good conductor and it is directly on to p of metal oxide layer 28 so this eliminates the poly depletion effect seen with polysilicon on top of gate dielectric.

Advantages of One or More Embodiments of the Invention

The advantages of one ore more embodiment of the method of the present invention include:
1) finalized gate 22' reduces leakage between gate and substrate;
2) finalized gate 22' has less poly depletion; and
3) transistors fabricated using the finalized gate structure 22' have improved performance, i.e. greater drive current and less leakage.

While particular embodiments of the present invention have been illustrated and described, it is not intended to limit the invention, except as defined by the following claims.

We claim:
1. A method of forming a gate, comprising the steps of:
   providing a substrate;
   forming a pre-gate structure over the substrate; the pre-gate structure including a sacrificial metal layer between an upper gate conductor layer and a lower gate dielectric layer; and
   annealing the pre-gate structure to form the gate; the gate comprising:
      an upper silicide layer formed from a portion of the sacrificial metal layer and a portion of the upper gate conductor layer from the anneal; and
      a lower metal oxide layer formed from a portion of the gate dielectric layer and a portion of the sacrificial metal layer from the anneal.

2. The method of claim 1, wherein: the sacrificial metal layer is comprised of a material selected from the group consisting of Ti, Ta, Zr, Hf and Al; the upper gate conductor layer is comprised of a material selected from the group consisting of polysilicon, poly SiGe and poly SiGe with a tungsten or a tungsten silicide cap layer; and the lower gate dielectric layer is comprised of silicon oxide formed by a process selected from the group consisting of oxidation, atomic layer deposition and chemical vapor deposition.

3. The method of claim 1, wherein: the sacrificial metal layer is comprised of a material selected from the group consisting of Ti and Ta; the upper gate conductor layer is comprised of polysilicon; and the lower gate dielectric layer is comprised of silicon oxide.

4. The method of claim 1, wherein: the sacrificial metal layer is comprised of Ta; the upper gate conductor layer is comprised of polysilicon; and the lower gate dielectric layer is comprised of silicon oxide.

5. The method of claim 1, wherein the sacrificial metal layer is from about 5 to 500 Å thick, the upper gate conductor layer is from about 300 to 2000 Å thick, and the lower gate dielectric layer is from about 5 to 200 Å thick.

6. The method of claim 1, wherein the sacrificial metal layer is from about 10 to 200 Å thick, the upper gate conductor layer is from about 500 to 1500 Å thick, and the lower gate dielectric layer is from about 10 to 60 Å thick.

7. The method of claim 1, wherein the sacrificial metal layer is from about 10 to 100 Å thick, the upper gate conductor layer is from about 500 to 1500 Å thick, and the lower gate dielectric layer is from about 10 to 60 Å thick.

8. The method of claim 1, wherein the sacrificial metal layer is formed by a physical vapor deposition process, the upper gate conductor layer is formed by a chemical vapor deposition process, and the lower gate dielectric layer is formed by an oxidation process.

9. The method of claim 1, wherein the gate is greater than about 100 Å wide.

10. The method of claim 1, wherein the gate is greater than about 300 Å wide.

11. The method of claim 1, wherein the sacrificial metal layer is completely consumed during the annealing step in forming the upper silicide layer and the lower metal oxide layer.

12. The method of claim 1, wherein the pre-gate structure anneal is a rapid thermal process.

13. The method of claim 1, wherein the gate is used to build transistors with improved performance.

14. A method of forming a gate, comprising the steps of:
   providing a substrate;
   forming a pre-gate structure over the substrate; the pre-gate structure including a sacrificial metal layer between an upper gate conductor layer and a lower gate dielectric layer; the sacrificial metal layer being comprised of a material selected from the group consisting of Ti, Ta, Zr, Hf and Al; the upper gate conductor layer being comprised of a material selected from the group consisting of polysilicon, poly SiGe and poly SiGe with a tungsten or a tungsten silicide cap layer; the lower gate dielectric layer being comprised of silicon oxide formed by a process selected from the group consisting of oxidation, atomic layer deposition and chemical vapor deposition; and annealing the pre-gate structure to form the gate; the gate comprising:
an upper silicide layer formed from a portion of the sacrificial metal layer and a portion of the upper gate conductor layer from the anneal; and
a lower metal oxide layer formed from a portion of the gate dielectric layer and a portion of the sacrificial metal layer from the anneal.

15. The method of claim 14, wherein: the sacrificial metal layer is comprised of a material selected from the group consisting of Ti and Ta; the upper gate conductor layer is comprised of polysilicon; and the lower gate dielectric layer is comprised of silicon oxide.

16. The method of claim 14, wherein: the sacrificial metal layer is comprised of Ta; the upper gate conductor layer is comprised of polysilicon; and the lower gate dielectric layer is comprised of silicon oxide.

17. The method of claim 14, wherein the sacrificial metal layer is from about 5 to 500 Å thick, the upper gate conductor layer is from about 300 to 2000 Å thick, and the lower gate dielectric layer is from about 5 to 200 Å thick.

18. The method of claim 14, wherein the sacrificial metal layer is from about 10 to 200 Å thick, the upper gate conductor layer is from about 500 to 1500 Å thick, and the lower gate dielectric layer is from about 10 to 60 Å thick.

19. The method of claim 14, wherein the sacrificial metal layer is from about 10 to 100 Å thick, the upper gate conductor layer is from about 500 to 100 Å thick, and the lower gate dielectric layer is from about 10 to 60 Å thick.

20. The method of claim 14, wherein the sacrificial metal layer is formed by a physical vapor deposition process, the upper gate conductor layer is formed by a chemical vapor deposition process, and the lower gate dielectric layer is formed by an oxidation process.

21. The method of claim 14, wherein the gate is greater than about 300 Å wide.

22. The method of claim 14, wherein the gate is greater than about 300 Å wide.

23. The method of claim 14, wherein the pre-gate structure anneal is a rapid thermal process.

24. The method of claim 14, wherein the gate is used to build transistors with improved performance.

25. A method of forming a gate, comprising the steps of:
providing a substrate;
forming a pre-gate structure over the substrate; the pre-gate structure including a sacrificial metal layer between an upper gate conductor layer and a lower gate dielectric layer; the sacrificial metal layer being comprised of a material selected from the group consisting of Ti and Ta; the upper gate conductor layer being comprised of polysilicon; the lower gate dielectric layer being comprised of silicon oxide; and
annealing the pre-gate structure to form the gate; the gate comprising:
an upper silicide layer formed from a portion of the sacrificial metal layer and a portion of the upper gate conductor layer from the anneal; and
a lower metal oxide layer formed from a portion of the gate dielectric layer and a portion of the sacrificial metal layer from the anneal.

26. The method of claim 25, wherein the lower gate dielectric layer is comprised of silicon oxide formed by a process selected from the group consisting of oxidation, atomic layer deposition and chemical vapor deposition.

27. The method of claim 25, wherein the sacrificial metal layer is comprised of Ta.

28. The method of claim 25, wherein the sacrificial metal layer is from about 5 to 500 Å thick, the upper gate conductor layer is from about 300 to 2000 Å thick, and the lower gate dielectric layer is from about 5 to 200 Å thick.

29. The method of claim 25, wherein the sacrificial metal layer is from about 10 to 200 Å thick, the upper gate conductor layer is from about 500 to 1500 Å thick, and the lower gate dielectric layer is from about 10 to 60 Å thick.

30. The method of claim 25, wherein the sacrificial metal layer is from about 10 to 100 Å thick, the upper gate conductor layer is from about 500 to 1500 Å thick, and the lower gate dielectric layer is from about 10 to 60 Å thick.

31. The method of claim 25, wherein the sacrificial metal layer is formed by a physical vapor deposition process, the upper gate conductor layer is formed by a chemical vapor deposition process, and the lower gate dielectric layer is formed by an oxidation process.

32. The method of claim 25, wherein the gate is greater than about 100 Å wide.

33. The method of claim 25, wherein the gate is greater than about 300 Å wide.

34. The method of claim 25, wherein the pre-gate structure anneal is a rapid thermal process.

35. The method of claim 25, wherein the gate is used to build transistors with improved performance.

* * * * *